United States Patent
Lee et al.

(10) Patent No.: US 8,238,185 B2
(45) Date of Patent: Aug. 7, 2012

(54) NON-VOLATILE MEMORY DEVICE HAVING TEMPERATURE COMPENSATOR AND MEMORY SYSTEM THEREOF

(75) Inventors: Seungjae Lee, Gyeonggi-do (KR); Sungsoo Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 344 days.

(21) Appl. No.: 12/608,295

(22) Filed: Oct. 29, 2009

(65) Prior Publication Data

US 2010/0110815 A1    May 6, 2010

(30) Foreign Application Priority Data

Nov. 4, 2008 (KR) .................. 10-2008-0108965

(51) Int. Cl.
*G11C 7/04* (2006.01)

(52) U.S. Cl. .................. 365/211; 365/212; 365/189.09

(58) Field of Classification Search .............. 365/211 O, 365/212 X, 189.09 X, 211, 212, 189.09
See application file for complete search history.

(56) References Cited

U.S. PATENT DOCUMENTS

| 7,450,456 | B2 * | 11/2008 | Jain et al. ...................... 365/212 |
| 7,451,053 | B2 * | 11/2008 | Jeong .............................. 702/99 |
| 7,643,889 | B2 * | 1/2010 | Jeong et al. .................. 374/170 |

FOREIGN PATENT DOCUMENTS

| JP | 05-234386 | 9/1993 |
| JP | 2002-184192 | 6/2002 |
| JP | 2002-367382 | 12/2002 |

\* cited by examiner

*Primary Examiner* — VanThu Nguyen
(74) *Attorney, Agent, or Firm* — Myers Bigel Sibley & Sajovec, P.A.

(57) ABSTRACT

Provided is a semiconductor memory device. The semiconductor memory device includes: a voltage generator adjusting a DC voltage supplied into the semiconductor memory device according to a current temperature; and a control logic activating a temperature detection operation of the voltage generator and an adjustment operation of the DC voltage according to an operation mode, wherein the voltage generator adjusts the DC voltage according to offset information about the semiconductor memory device.

10 Claims, 13 Drawing Sheets

Fig. 5

| Current Temperature (Code2) | Offset_2 | Operation Mode ||||||||||||||
|---|---|---|---|---|---|---|---|---|---|---|---|---|---|---|
| | | Program(Binary) ||||| Read(Binary) ||||| Erase(Binary) ||
| | | Vpgm | Vpass | Vvfy1 | Vvfy2 | Vvfy3 | Vread | Vrd1 | Vrd2 | Vrd3 | V_WL | Vers |
| 0000 (T≤-45°C) | 00 | 0111 | 0011 | 1100 | 1110 | 1111 | 0111 | 1000 | 1010 | 1100 | 0011 | 0111 |
| | 01 | 0110 | 0011 | 1011 | 1101 | 1110 | 0111 | 0111 | 1001 | 1011 | 0011 | 0110 |
| | 10 | 0101 | 0010 | 1010 | 1100 | 1101 | 0110 | 0110 | 1000 | 1010 | 0010 | 0101 |
| | 11 | 0100 | 0010 | 1001 | 1011 | 1100 | 0110 | 0101 | 0111 | 1001 | 0010 | 0100 |
| 0001 (-45°C<T≤-35°C) | 00 | 0110 | 0011 | 1010 | 1100 | 1110 | 0110 | 0101 | 1000 | 1010 | 0011 | 0110 |
| | 01 | 0101 | 0011 | 1001 | 1011 | 1101 | 0110 | 0101 | 0111 | 1001 | 0011 | 0101 |
| | 10 | 0100 | 0010 | 1000 | 1010 | 1100 | 0101 | 0100 | 0110 | 1000 | 0010 | 0100 |
| | 11 | 0011 | 0010 | 0111 | 1001 | 1001 | 0101 | 0011 | 0101 | 0111 | 0010 | 0011 |
| 0010 (-35°C<T≤-25°C) | 00 | 0101 | 0010 | 1001 | 1011 | 1101 | 0101 | 0101 | 0110 | 1000 | 0010 | 0100 |
| | 01 | 0100 | 0010 | 1000 | 1010 | 1100 | 0101 | 0100 | 0101 | 0111 | 0010 | 0100 |
| | 10 | 0011 | 0001 | 0111 | 1001 | 1011 | 0100 | 0011 | 0100 | 0110 | 0001 | 0010 |
| | 11 | 0010 | 0001 | 0110 | 1000 | 1010 | 0100 | 0010 | 0011 | 0101 | 0001 | 0001 |
| ... | ... | ... | ... | ... | ... | ... | ... | ... | ... | ... | ... | ... |
| 1000 (45°C<T≤55°C) | 00 | 0000 | 0000 | 0000 | 0000 | 0000 | 0000 | 0000 | 0000 | 0000 | 0000 | 0000 |
| | 01 | 0000 | 0001 | 0000 | 0001 | 0001 | 0000 | 0001 | 0010 | 0010 | 0000 | 0001 |
| | 10 | -0001 | 0010 | 0010 | 0010 | 0010 | 0001 | 0010 | 0100 | 0110 | 0000 | 0010 |
| | 11 | -0001 | 0011 | 0011 | 0011 | 0011 | 0001 | 0011 | 0110 | 0111 | 0000 | 0011 |
| ... | ... | ... | ... | ... | ... | ... | ... | ... | ... | ... | ... | ... |
| 1111 (125°C<T) | 00 | -0111 | -0011 | -1100 | -1110 | -1111 | -0111 | -1000 | -1010 | -1100 | -0011 | -0111 |
| | 01 | -0110 | -0011 | -1011 | -1101 | -1110 | -0111 | -0111 | -1001 | -1011 | -0011 | -0110 |
| | 10 | -0101 | -0010 | -1010 | -1100 | -1101 | -0110 | -0110 | -1000 | -1010 | -0010 | -0101 |
| | 11 | -0100 | -0010 | -1001 | -1011 | -1100 | -0110 | -0101 | -0111 | -1001 | -0010 | -0100 |

US 8,238,185 B2

NON-VOLATILE MEMORY DEVICE HAVING TEMPERATURE COMPENSATOR AND MEMORY SYSTEM THEREOF

REFERENCE TO PRIORITY APPLICATION

This application claims priority to Korean Patent Application No. 10-2008-0108965, filed Nov. 4, 2008, the contents of which are hereby incorporated herein by reference.

FIELD OF THE INVENTION

The present invention disclosed herein relates to a non-volatile semiconductor device, and more particularly, to a non-volatile memory device for compensating for changes of various conditions occurring according to a temperature change.

BACKGROUND

As a non-volatile memory device, a flash memory device is an integrated circuit capable of storing or reading information at a preferred point. A flash memory device includes a plurality of rewritable memory cells. Each memory cell stores 1-bit data or multi-bit data. If 1-bit data is stored in one memory cell, the memory cell has program states corresponding to two threshold voltage distributions. That is, the memory cell is programmed to have a threshold voltage corresponding to one of data '1' and data '0'. A multi level cell (MLC) storing multi-bit data in one memory cell has more program states. That is, if 2-bit data are stored in one memory cell, the memory cell is programmed with a threshold voltage included in one of four threshold voltage distributions. If 3-bit data are stored in one memory cell, the memory cell is programmed with a threshold voltage included in one of eight threshold voltage distributions. Recently, various techniques for storing 4-bit data in one memory cell are actively under development.

Data stored in a memory cell are read by detecting a threshold voltage amplitude of a memory cell. However, a threshold voltage of a memory cell may shift due to various factors. A threshold voltage of a memory cell may vary based on temperature and procedures. Additionally, a threshold voltage of a memory cell may shift due to program disturbance, read disturbance, and erase disturbance. Furthermore, a threshold voltage may shift due to charge loss in a floating gate of a memory cell. The shift of a threshold voltage becomes an obstacle when an MLC is realized to store the more number of bits in one memory cell. Various solutions for the shift of a threshold voltage have been suggested. However, these methods cause great signal delay and cannot keep up with a current mobile trend intended for high data capacity and high data rate. Therefore, techniques that can promptly resolve the shift of a threshold voltage without impeding memory performance are urgently required.

SUMMARY

The present invention provides a non-volatile memory device capable of detecting and compensating for cell characteristics changed according to a temperature, a memory system thereof, and a controlling method thereof.

Embodiments of the present invention provide semiconductor memory devices including: a voltage generator adjusting a DC voltage supplied into the semiconductor memory device according to a current temperature; and a control logic activating a temperature detection operation of the voltage generator and an adjustment operation of the DC voltage according to an operation mode, wherein the voltage generator adjusts the DC voltage according to offset information about the semiconductor memory device.

In other embodiments of the present invention, methods of controlling a semiconductor memory device include: receiving a command from the external; adjusting DC voltages consumed during a plurality of operation procedures constituting an operation mode corresponding to the command with reference to a current temperature and a offset value in each device; and performing the plurality of operation procedures according to the adjusted DC voltages.

In still other embodiments of the present invention, memory systems include: a plurality of semiconductor memory devices; and a memory controller controlling the plurality of semiconductor memory devices, where each of the semiconductor memory devices includes: a voltage generator adjusting a DC voltage supplied into the semiconductor memory device according to a current temperature; and a control logic activating a temperature detection operation of the voltage generator and an adjustment operation of the DC voltage according to an operation mode, wherein the voltage generator adjusts the DC voltage according to offset information about the semiconductor memory device.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 5 is a table illustrating one example of a look-up table stored in a temperature code register of FIG. 4;

DETAILED DESCRIPTION OF PREFERRED EMBODIMENTS

Figure 1:
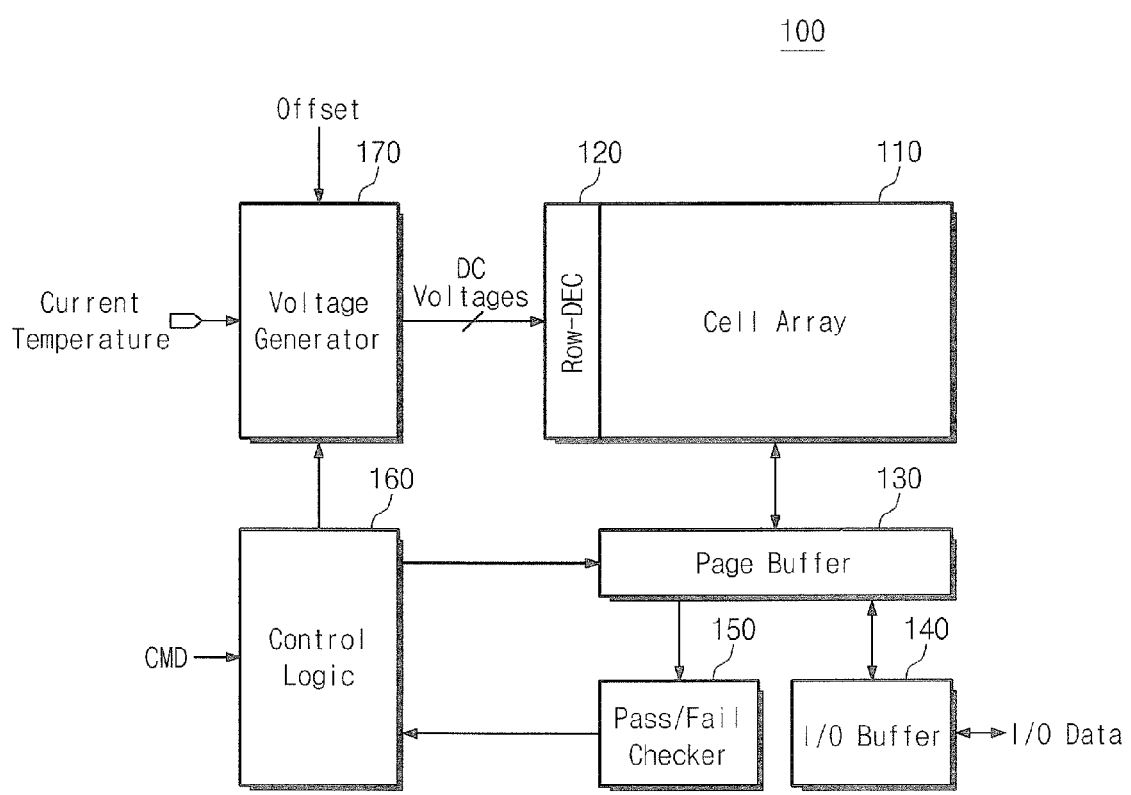
FIG. 1 is a block diagram illustrating a flash memory device according to an embodiment of the present invention.

It should be construed that foregoing general illustrations and following detailed descriptions are exemplified and an additional explanation of claimed inventions is provided. Reference numerals are indicated in detail in preferred embodiments of the present invention, and their examples are represented in reference drawings. In every possible case, like reference numerals are used for referring to the same or similar elements in the description and drawings.

Below, a NAND flash memory device is used as one example for illustrating characteristics and functions of the present invention. However, those skilled in the art can easily understand other advantages and performances of the present invention according to the descriptions. The present invention may be embodied or applied through other embodiments. Besides, the detailed description may be amended or modified according to viewpoints and applications, not being out of the scope, technical idea and other objects of the present invention. Preferred embodiments of the present invention will be described below in more detail with reference to the accompanying drawings.

FIG. 1 is a block diagram illustrating a flash memory device 100 capable of detecting and compensating for a temperature change according to an embodiment of the present invention. Referring to FIG. 1, the flash memory device 100 includes a voltage generator 170 that detects a current temperature and then generates a voltage level corresponding thereto. Additionally, the voltage generator detects a current temperature in various operation modes and then, adjusts and outputs a DC voltage according to the detected temperature. More detailed description will be made below.

A cell array 110 includes memory cell connected to a bit line and a word line. Especially, a multi level cell (MLC) is programmed to have a threshold voltage corresponding to one of threshold voltage distributions in order to store a plurality of bits in one cell. An MLC needs to be programmed densely in order to have the number of threshold voltage states $2^k$ corresponding to the number of bits k stored in a limited threshold voltage window. Therefore, a read margin of an MLC has to be reduced more compared to a single level cell. Moreover, a temperature change may shift distributions of memory cells. The temperature change may change memory cell distributions and typical operational characteristics inside a chip. In order to minimize influence of a temperature change, temperature detection and an active solution according thereto are required.

A row decoder, or Row-DEC 120, typically selects a word line in response to a row address. The row decoder 120 delivers various word line voltages provided from the voltage generator 170 into selected word lines. During a program operation, a program voltage Vpgm of about 15 V to about 20V and a verify voltage Vvfy are delivered to a selected word line WL and a pass voltage Vpass is delivered to an unselected word line WL. During a read operation, the row decoder 120 provides a read voltage Vrd from the voltage generator 170 to a selected word line and provides a read voltage Vread of about 5 V into an unselected word line.

A page buffer 130 operates as a write driver or a detection amplifier according to an operation mode. For example, the page buffer 130 operates as a detection amplifier during a read operation mode and operates as a write driver during a program operation mode. Although not illustrated, during a program operation mode or a read operation mode, the page buffer 130 may receive DC voltages such as bit line precharge voltage as a value that is compensated according to a current temperature, from the voltage generator 170.

An input/output (I/O) buffer 140 temporarily stores an address or program data, inputted through an input/output pin I/Oi. The I/O buffer 140 delivers the stored address to an address buffer (not shown), program data to the page buffer 130, and an instruction to an instruction register (not shown). During a read operation, data read by an adjusted read voltage are outputted to the external through the I/O buffer 140.

A pass/fail checker 150 determines whether programming of memory cells selected during a program operation is completed or not. During a program operation, selected memory cells programmed using a program voltage are read by a verify voltage Vvfy. The read verify data are temporarily stored in the page buffer 130, and are scanned by the pass/fail checker 150. It is determined whether memory cells selected based on the scanning result is normally programmed or not. The pass/fail checker 150 may be constituted including a logic circuit or a wired-OR method.

A control logic 160 controls the voltage generator 170 or the page buffer 130 according to an operation mode. The control logic 160 performs a plurality of sequences corresponding to each of operation modes that a command CMD instructs. The control logic 160 may adjust a DC voltage first in response to a program or read command. The control logic 160 may control the voltage generator 170 and the page buffer 130 in order to program or read inputted data using an adjusted DC voltage. Additionally, the control logic 160 may adjust a DC voltage in response to a command for performing an adjustment operation of a DC voltage.

The voltage generator 170 generates a DC voltage according to a control of the control logic 160. The voltage generator 170 includes a unit for detecting a temperature of the flash memory device 100 in response to a control of the control logic 160. Additionally, the voltage generator 170 includes a unit for adjusting DC voltages provided as a default value by referring to the detected temperature. The voltage generator 170 provides a DC voltage that is adjusted to compensate for characteristic changes of threshold voltages of memory cells shifted according to temperature and other environments or devices in a chip. For example, the voltage generator 170 detects a current temperature and adjusts a DC voltage by referring to the detected current temperature during a program operation mode. Next, program procedures are accomplished using the adjusted DC voltage. During a read operation mode, the voltage generator 170 detects a current temperature in response to a control of the control logic 160, and adjusts a DC voltage by referring to the detected temperature. Additionally, the DC voltage of an adjusted level is provided into word lines. Here, a general word line voltage to be provided during each operation mode is commonly called as a DC voltage. For example, during a program operation mode, a program voltage Vpgm, a pass voltage Vpass, and a verify voltage Vvfy as a DC voltage are provided to a word line. During a read operation mode, read voltages Vread, Vrd1, Vrd2, . . . , Vrdn as a DC voltage are provided to a word line. Furthermore, the voltage generator 170 receives an offset value. An operation for sensing a current temperature is greatly affected by process variables. Offset is a signal or data for reducing errors that occur according to offset of threshold voltages in a transistor during detecting of a temperature in each chip or package. Additionally, offset may be provided through a fuse program. Or, offset is programmed in a specific region of the cell array 110, and also is read during booting and then is provided as initial data.

According to the embodiment of the present invention described with reference to FIG. 1, the flash memory device 100 includes an operation for detecting a current temperature among general procedures of each operation mode. The DC voltages provided as a default value according to the detected current temperature are adjusted and then, operations that commands instruct are executed under the adjusted DC voltage environment. Accordingly, the flash memory device 100 can compensate for a threshold voltage of a memory cell shifted according to a temperature and other environments or characteristic changes of devices in a chip. Therefore, the flash memory device 100 can provide high reliability regardless of operational conditions or characteristic changes. Here, a DC voltage is described as a read voltage or a verify voltage among word line voltages provided to the cell array 110, but embodiments of the present invention are not limited thereto. The DC voltage may include various kinds of voltages consumed in a memory device with diverse purposes.

Figure 2:
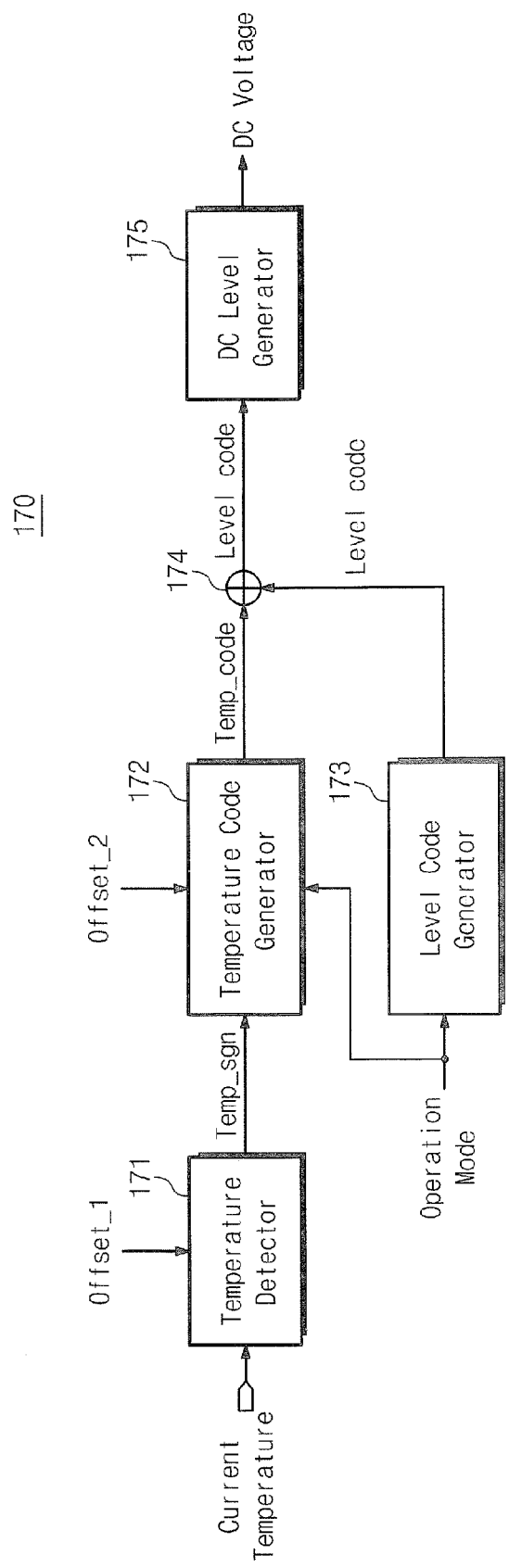
FIG. 2 is a block diagram illustrating detailed configuration of a voltage generator of FIG. 1.

FIG. 2 is a block diagram illustrating detailed configuration of the voltage generator 170 of FIG. 1. Referring to FIG. 2, the voltage generator 170 includes a temperature detector 171 for detecting a current temperature and a temperature code generator 172 for converting a current temperature value detected in an analog signal into code data. The temperature detector 171 detects a current temperature with high sensitivity using the first offset Offset_1 that compensates for offset of a reference voltage in each device. The temperature code generator 172 encodes an analog signal Temp_sgn corresponding to the detected current temperature. The temperature code generator 172 generates an optimized temperature code Temp_code in each chip or package of the flash memory device 100 according to an operation mode and the second offset Offset_2. Through the temperature detector 171 and the temperature code generator 172, the current temperature value is generated as the temperature code Temp_code with which an arithmetic operation may be possible.

Additionally, the voltage generator 170 includes a level code generator 173 for generating a level of a DC voltage corresponding to an operation mode. The level code generator 173 outputs a level code Level_code for generating a DC voltage used in a corresponding operation mode in response to an operation mode provided from the control logic 160. The level code Level_code outputted from the level code generator 173 are data for generating a default value of a DC voltage consumed in each operation mode. If an operation mode is a program mode, the level code generator 173 outputs a level code Level_code in order to generate a DC voltage used in a program mode. For example, the level code generator 173 outputs a level code Level_code corresponding to a program voltage Vpgm, a pass voltage Vpass, and a verify voltage Vvfy. The level code generator 173 outputs a level code Level_code in order to generate DC voltages applied to a word line of the cell array 110 in a specific operation mode and also generate general DC voltages used in the flash memory device 100.

An adder 174 adds the temperature code Temp_code generated through temperature detection to the level code Level_code corresponding to an operation mode. The adder 174 delivers the temperature code Temp_code and the level code Level_code (outputted as a default value) into a DC level generator 175 as an adjusted level code Level_code'. The DC level generator 175 generates DC voltages according to the adjusted level code Level_code'.

The voltage generator 170 generates a DC voltage corresponding to a current temperature and thus actively adapts itself to characteristic changes of a chip or package. The voltage generator 170 generates DC voltages to compensate for the shift of a threshold voltage in a memory cell or characteristic changes according to a temperature of devices. Accordingly, all environmental changes occurring due to a temperature change can be compensated regardless of the conditions under which memory cells are programmed or whether a threshold voltage of memory cells is changed.

Figure 3:
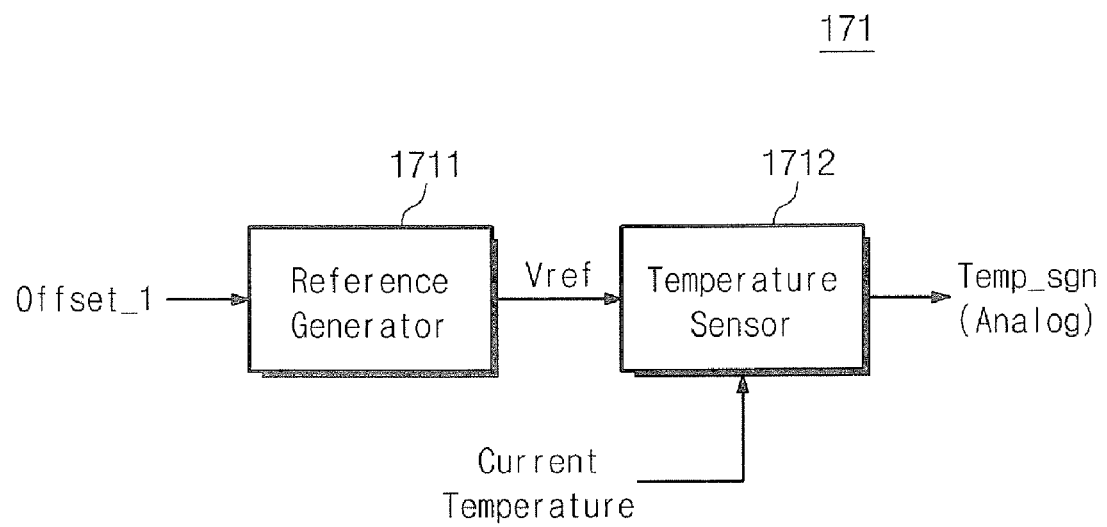
FIG. 3 is a block diagram illustrating detailed configuration of a temperature detector of FIG. 2.

FIG. 3 is a block diagram illustrating detailed configuration of the temperature detector 171 of FIG. 2. Referring to FIG. 3, the temperature detector 171 includes a reference generator 1711 and a temperature sensor 1712.

The reference generator 1711 generates a reference voltage Vref of a stable level in spite of peripheral temperature changes, procedure changes, and various environment changes. The reference generator 1711 is equipped in a semiconductor device to provide a stable power supply. Factors that make an internal voltage unstable include a temperature change due to external environmental changes and manufacturing processes' diverse variables. In order to compensate for offset of each device, the reference generator 1711 receives the first offset Offset_1. The reference generator 1711 generates a highly accurate and reliable reference voltage Vref by referring to the first offset Offset_1. Additionally, one example of the reference generator 1711 that is well known for always generating a safe reference voltage Vref with respect to a temperature and variables of manufacturing processes is a band-gap reference voltage circuit.

The temperature sensor 1712 converts a current temperature into a temperature signal Temp_sgn of an analog format by referring to the reference voltage Vref. As a temperature sensing unit of the temperature sensor 1712, a diode having a threshold voltage, which is changed according to a temperature change, can be used. However, configuration of the temperature sensing unit is not limited thereto. The temperature signal Temp_sgn in an electric signal format into which a current temperature value is converted is not suitable to various logic calculations. Accordingly, the temperature signal Temp_sgn of an analog format needs to be converted into a discrete signal later on.

Figure 4:
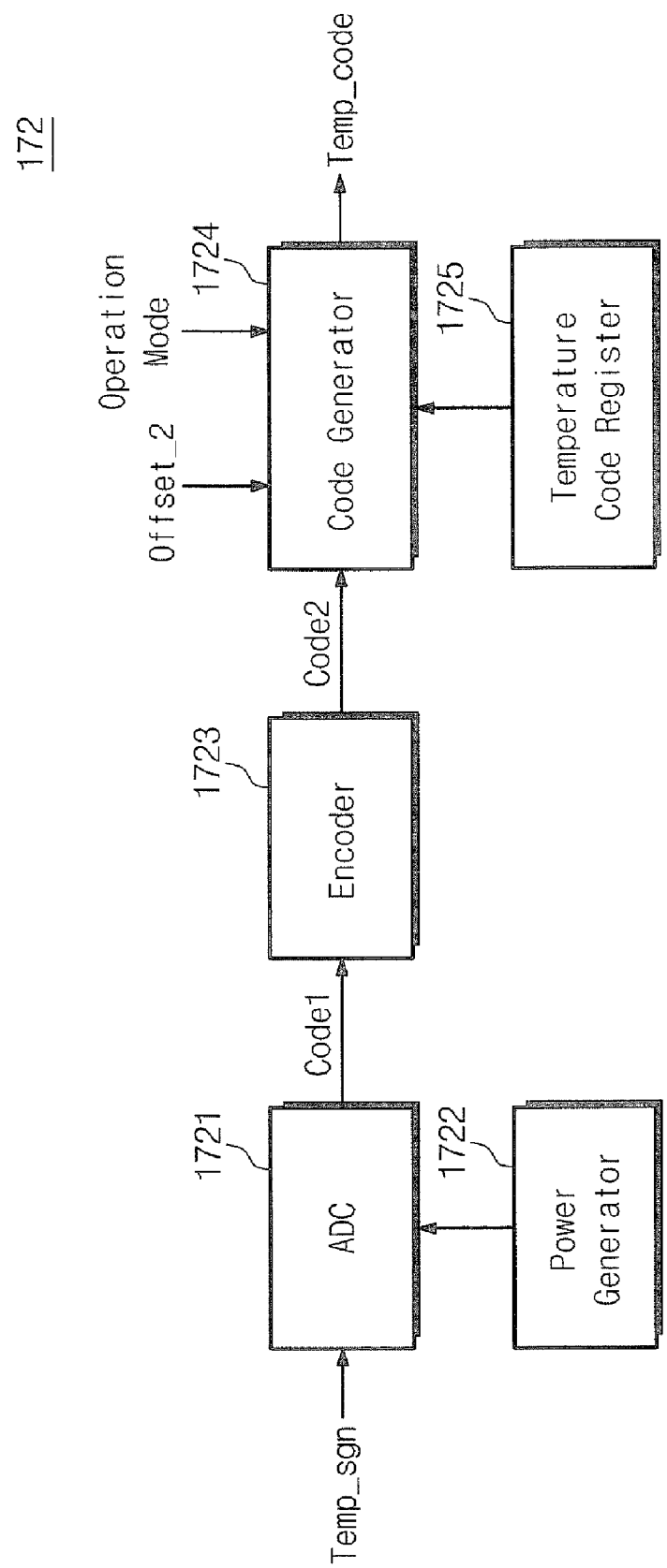
FIG. 4 is a block diagram illustrating detailed configuration of a temperature code generator of FIG. 2.

FIG. 4 is a block diagram illustrating detailed configuration of the temperature code generator 172 of FIG. 2. Referring to FIG. 4, the temperature code generator 172 receives a temperature signal Temp_sgn of an analog format and generates a temperature code Temp_code of a digital format. For this, the temperature code generator 172 includes an analog-digital converter (or, ADC) 1721, an encoder 1723, a code generator 1724, and a temperature code register 1725.

The analog-digital converter 1721 converts a temperature signal Temp_sgn into a first code code1 of a digital format. In order to convert the temperature signal Temp_sgn into a digital format, a quantization process is required. The analog-digital converter 1721 needs to be supplied with power supply of a stable level in order to perform a quantization process for converting a continuous signal into a discrete signal. Accordingly, the analog-digital converter 1721 needs to include the power generator 1722 to provide a power source of a stable level to the analog-digital converter 1721.

The encoder 1723 converts the first code code1 outputted from the analog-digital converter 1721 into a second code code2 having a code length suitable for transmission and calculation. The first code code1 outputted from the analog-digital converter 1721 has a long code length due to performing of a quantization operation on the temperature signal Temp_sgn. Accordingly, it is necessary to convert the first code code1 into the second code code2 that has a short code length for transmission and calculation.

The code generator 1724 generates a temperature code Temp_code in order to compensate for a current temperature in response to the second code code2. The code generator 1724 receives the second offset Offset_2 in order to compensate for an offset value in each chip or package of the temperature detector 172 through a code. The code generator 1724 receives an operation mode that a command instructs. The code generator 1724 accesses the temperature code register 1725 by referring to the second code code2, the operation mode, and the second offset Offset_2. The code generator 1724 searches the temperature code register 1724 to find a temperature code Temp_code that satisfies at least three above components. The selected temperature code Temp_code is delivered to the adder 174 to be added to the level code Level_code that is provided as a default value.

The temperature code register 1725 stores a variety of a temperature code Temp_code in a kind of a look-up table. That is, the temperature code Temp_code corresponding to the second code code2 is classified according to each operation mode and each second offset Offset_2. When one second code code2 is provided from a program operation mode, the code generator 1724 searches a corresponding temperature code Temp_code from the temperature code register 1725. Through the search, a temperature code for compensating default DC voltage values at a current temperature is delivered into the code generator 1724.

FIG. 5 is a table illustrating one example of a look-up table stored in the temperature code register 1725 of FIG. 4. Referring to FIG. 5, the code generator 1724 receives the second code code2 from the encoder 1723 and searches a look-up table in the temperature code register 1725. Especially, the code generator 1724 selects a temperature code Temp_code for compensating for a DC voltage from the look-up table by referring to the operation mode and the second offset Offset_2 from the control logic 160. The second offset Offset_2 is data for compensating for inevitable offset occurring during sensing of a temperature in each chip or package. Accordingly, the code generator 1724 selects a temperature code Temp_code corresponding to the second code code2, the operation mode, and the second offset Offset_2, from the look-up table.

For example, let's assume in the current flash memory device 100 that a chip temperature is a reference temperature of about 50° C. and a second offset Offset_2 of a chip is logic '10' and an inputted command is a program command. At this point, the second code code2 is provided to the code generator 1724 as logic '1000'. Then, the code generator 1724 searches the temperature code register 1725 to select a temperature code Temp_code corresponding to the above three components. That is, '0001' is selected as a temperature code for compensating for a program voltage Vpgm and '0010' is selected as a temperature code for compensating for a pass voltage Vpass and '0010', '0010', and '0010' are selected, respectively, as temperature codes for compensating for three verify voltages Vvfy1, Vvfy2, and Vvfy3. Additionally, let's assume in the current flash memory device 100 that a chip temperature is about −40° C. and a second offset Offset_2 of a chip is logic '11' and an inputted command is a read command. At this point, the second code code2 is provided to the code generator 1724 as logic '0001'. Then, the code generator 1724 searches the temperature code register 1725 to select a temperature code Temp_code corresponding to the above-mentioned three components (that is, code2, Offset_2, and an operation mode). That is, during a read operation mode, '0101' is selected as a temperature code for compensating for a read voltage Vread provided to a word line of unselected cells and '0011', '0101', and '0111' are selected as temperature codes for compensating for read voltages Vrd1, Vrd2, and Vrd3 used to identify each state.

Let's assume in the current flash memory device 100 that a chip temperature is about 130° C. and a second offset Offset_2 of a chip is logic '00' and an inputted command is an erase command. At this point, the second code code2 is provided to the code generator 1724 as logic '1111'. Then, the code generator 1724 searches the temperature code register 1725 to select a temperature code Temp_code corresponding to the above-mentioned three components. That is, during an erase operation mode, '−0011' is selected as a temperature code for compensating for a word line voltage $V_{WL}$ and '−0111' is selected as a temperature code for compensating for an erase voltage Vers provided to a bulk region during an erase operation. Here, it is apparent to those skilled in the art that a binary code indicated with a negative number can be changed into 2's complementary for an addition operation.

Here, although an exemplary embodiment of a look-up table in the temperature code register 1725 is described, configuration of the look-up table is not limited to the above-mentioned table. For example, even if a value of the second code code2 is changed with respect to the same operation mode and the same second offset Offset_2, a specific DC voltage (for example, Vread) is not adjusted and only DC voltages Vrd1, Vrd2, and Vrd3 can be changed. That is, DC voltages that do not relatively greatly affect reliability or performance of a memory device according to a temperature change may not be adjusted or adjusted less.

Figure 6:
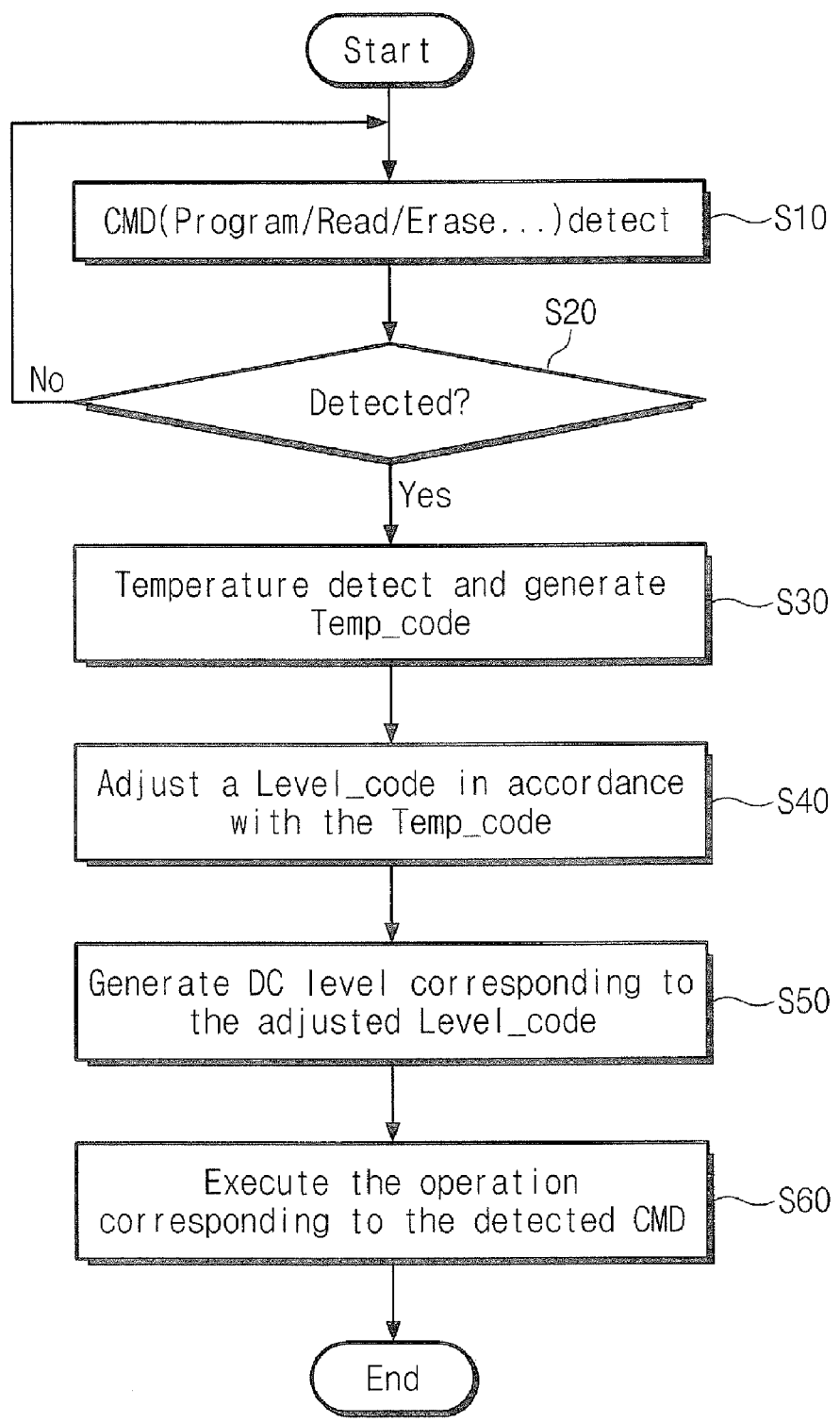
FIG. 6 is a flowchart illustrating schematic operations according to an embodiment of the present invention.

FIG. 6 is a flowchart illustrating schematic operations of the control logic 160 of FIG. 1 and the voltage generator 170 in response to an input of a command. The flash memory device 100 detects a temperature and adjusts the following DC voltage in response to a command CMD from the external. After a DC voltage corresponding to a current temperature is adjusted, an operation that a command CMD instructs is performed. More detailed description is as follows.

The control logic 160 of FIG. 1 monitors a command CMD provided from the external in operation S10. When it is determined that the command CMD is inputted from the external, the control logic 160 performs an operational procedure including adjusting a DC voltage according to an embodiment of the present invention. However, if an input of a command CMD is not detected, it is on standby until a command CMD is inputted in operation S20.

Once it is determined that a command CMD is inputted, the control logic 160 controls the voltage generator 170 to detect a current temperature of the flash memory device 100. The voltage generator 170 converts the current temperature into a temperature signal Temp_sgn of an analog format. The temperature signal Temp_sgn goes through quantization and encoding operations and then is outputted as a temperature code Temp_code in operation S30. The temperature code Temp_code is added to a level code Level_code corresponding to a default value of a general DC voltage generated in a current operation mode in operation S40. Next, DC voltages are generated through a level code Level_code' compensated by the temp code Temp_code in operation S50. An operation that a command CMD instructs (for example, a program, erase, or read operation) is performed according to DC voltages optimized for a current temperature in operation S60. Once an operation corresponding to the command CMD is completed, a general operation of the flash memory device 100 accompanied by the temperature compensation according to an embodiment of the present invention is terminated.

As mentioned above, once a specific command is inputted, an operation method accompanied by detecting of a temperature and generating of an optimized DC voltage corresponding to the detected temperature is described according to an embodiment of the present invention. Here, although temperature detection and DC voltage adjustment are performed first before an operation corresponding to a command is performed, embodiments of the present invention are not limited thereto. For example, the temperature detection and DC voltage adjustment may be performed during one or more procedures among a plurality of procedures for an operation mode inputted by a command.

Figure 7A:
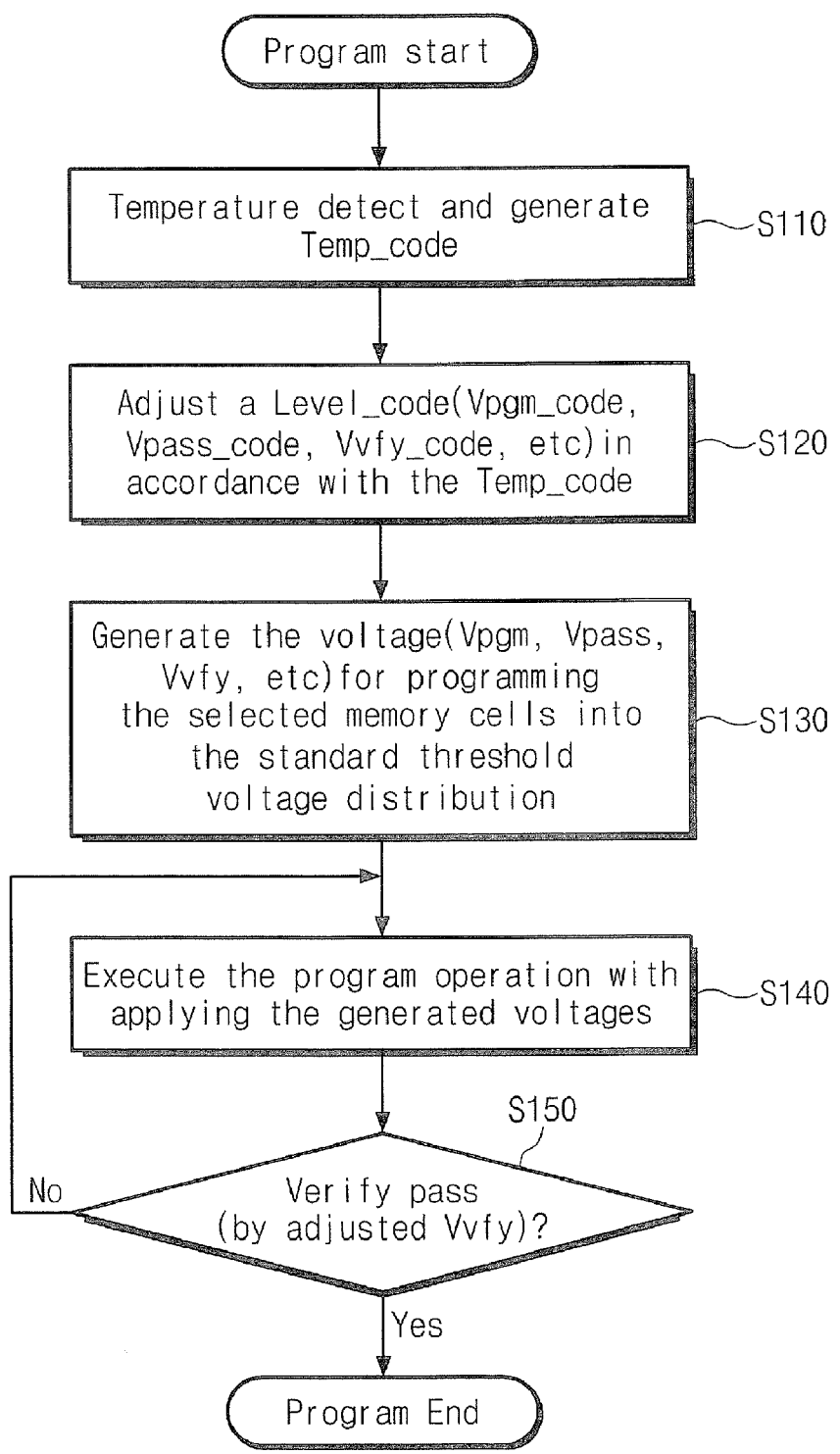
FIG. 7A is a flowchart illustrating a programming method according to an embodiment of the present invention.

FIG. 7A is a flowchart illustrating a program procedure including a temperature compensation procedure when a program command is inputted according to an embodiment of the present invention. Once a program command CMD is inputted, the control logic 160 controls the voltage generator 170 to detect a current temperature of the flash memory device 100. The voltage generator 170 generates a temperature signal Temp_sgn by detecting a current temperature in operation 5110. The temperature signal Temp_sgn goes through quantization and encoding operations and then is outputted as a temperature code Temp_code. The temperature code Temp_code needs to be added to a level code Level_code for generating a default value of a general DC voltage, which is generated during a current operation mode. During a program operation, the level code Level_code may include a program voltage code Vpgm_code, a pass voltage code Vpass_code, and a verify voltage code Vvfy_code. The temp code Temp_code is added to the program voltage code Vpgm_code, the pass voltage code Vpass_code, and the verify voltage code Vvfy_code, which are provided as default values in operation S120. An adjusted level code Level_code' generated according to an addition of the temperature code Temp_code is delivered to the DC level generator 175 of FIG. 2 in operation S130. The DC level generator 175 receives the level code Level_code' adjusted by the temperature code Temp_code and then generates general DC voltages consumed during a program operation. That is, the DC level generator 175 generates DC voltages such as Vpgm, Vpass, Vvfy, etc. corresponding to the adjusted level code Level_code' in operation S130. Once the general DC voltages such as Vpgm, Vpass, Vvfy, etc. for a program operation are generated, the control logic 160 applies these voltages to program selected memory cells in operation S140. After a program operation is performed, a verify operation is performed to determine where the program operation is successful or not. During a verify operation, a verify voltage Vvfy adjusted according to a current temperature is provided in operation S150. Based on a result of the verify operation, if it is determined that general memory cells are programmed correctly, a program procedure is terminated. However, if any one of memory cells is not programmed with a target state, a program operation needs to be performed again.

Although the DC voltages Vpgm, Vpass, and Vvfy adjusted according to a current temperature during a program operation are used as one example, embodiments of the present invention are not limited thereto. That is, DC voltages consumed during a program operation include all general DC voltages consumed in the flash memory device 100 by including a precharge voltage provided to a bit line and selection line voltages Vss1 and Vgs1 provided to selection lines.

Figure 7B:
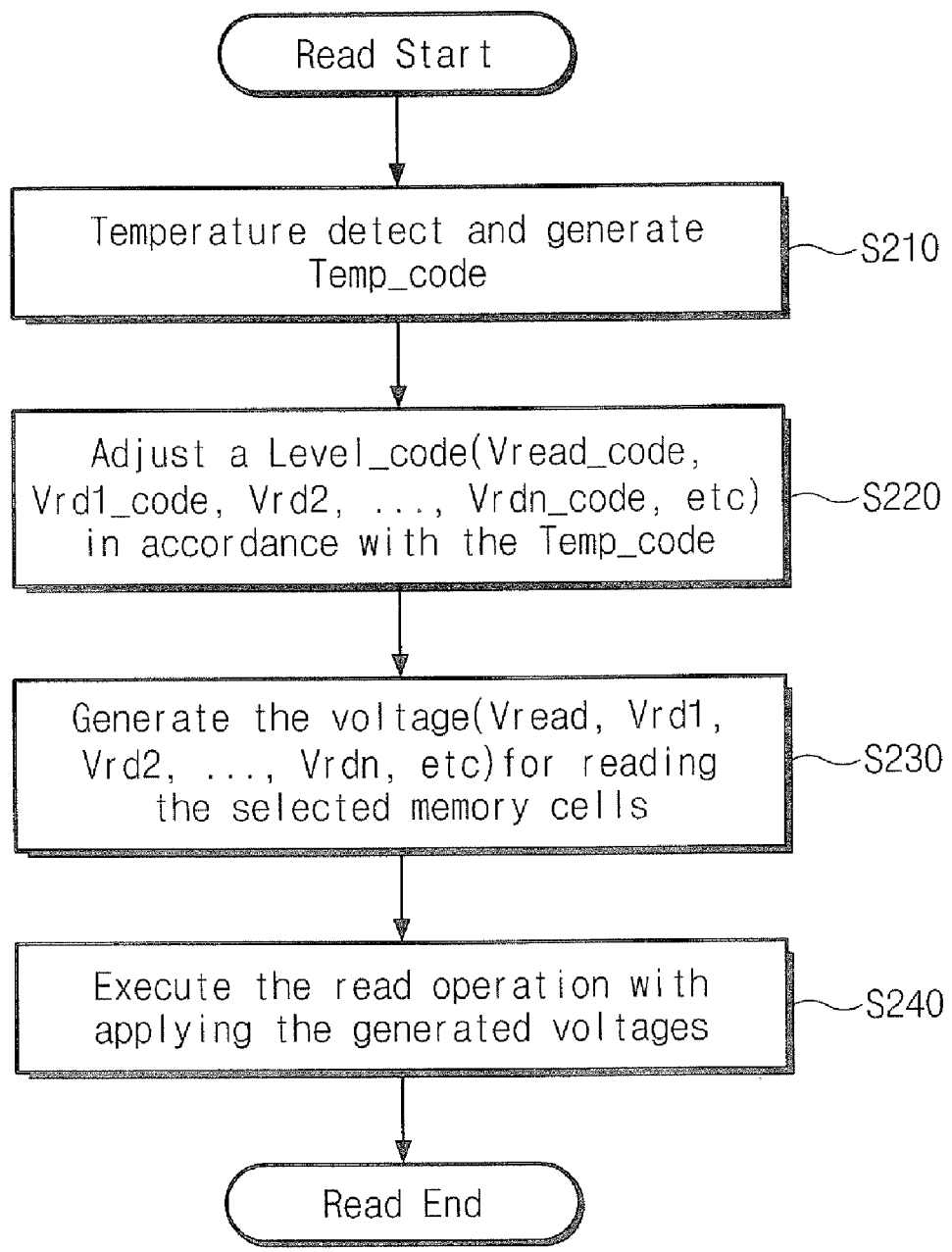
FIG. 7B is a flowchart illustrating a reading method according to an embodiment of the present invention.

FIG. 7B is a flowchart illustrating an operational procedure including a temperature compensation operation when a read command is inputted according to an embodiment of the present invention. Once a read command CMD is inputted, the control logic 160 controls the voltage generator 170 to detect a current temperature of the flash memory device 100. The voltage generator 170 generates a temperature signal Temp_sgn by detecting a current temperature. The temperature signal Temp_sgn goes through quantization and encoding operations and then is outputted as a temperature code Temp_code in operation S210. The temperature code Temp_code needs to be added to a level code Level_code for generating a default value of a general DC voltage that is generated during a current operation mode. During a read operation, the level code Level_code is provided to select memory cells and includes read voltage codes Vrd2_code, Vrd2_code, . . . , Vrdn_code for identifying each of program states. Additionally, a read voltage Vread_code may be included to turn on unselected memory cells. The temperature code Temp_code is added to the read voltage codes Vrd1_code, Vrd2_code, . . . , Vrdn_code provided as a default value and a read voltage code Vread_code for turning on unselected memory cells. An adjusted level code Level_code' generated according to an addition of the temperature code Temp_code is delivered to the DC level generator 175 of FIG. 2 in operation 5220. The DC level generator 175 receives the level code Level_code' adjusted by the temperature code Temp_code and then generates general DC voltages consumed during a read operation. That is, the DC level generator 175 generates the DC voltages Vrd1, Vrd2, . . . , Vrnd, and Vread corresponding to the adjusted level code Level_code' in operation 5230. Once the general DC voltages Vrd1, Vrd2, . . . , Vrnd, and Vread for a read operation are generated completely, the control logic 160 applies these voltages to sense selected memory cells in operation 5240.

It is described above that the DC voltage adjustment can be made on read voltages and general inner voltages of the flash memory device 100. A stable read margin can be provided regardless of the conditions under which memory cells are programmed through temperature detection and selection of a DC voltage corresponding to the detected temperature during a read operation. Although procedures during a program or read operation mode of FIGS. 7A and 7B are described, embodiments of the present invention may be applied to operation modes besides the above command.

Figure 8:
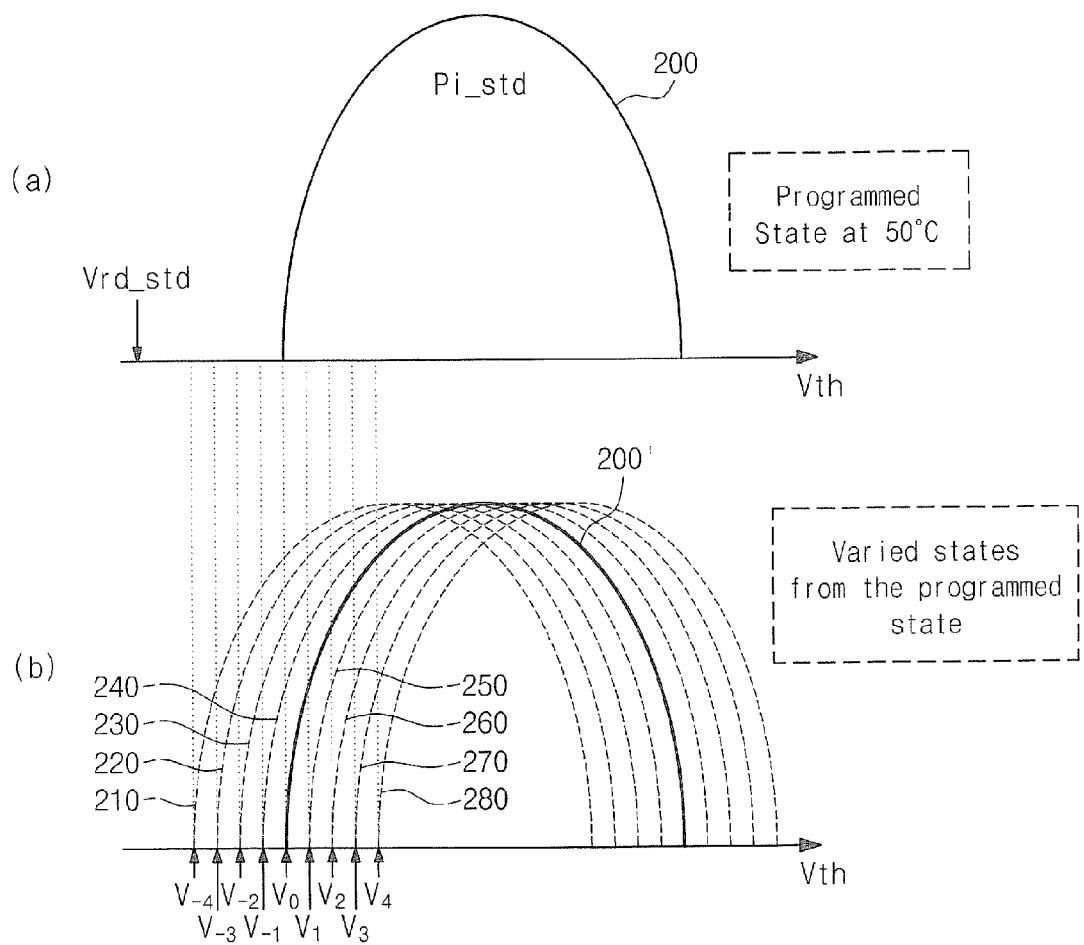
FIG. 8 is a diagram illustrating changes of a DC voltage according to an embodiment of the present invention.

FIG. 8 is a diagram illustrating an example of a DC voltage based on a temperature change according to an embodiment of the present invention. Referring to FIG. 8, an adjustment method of a DC voltage with respect to a specific program state Pi will be described. Let's assume that reference distribution 200 with respect to a specific program state Pi is a distribution Pi_std programmed according to a verify voltage V0 at a chip temperature of about 50° C. This program state Pi_std is shown in a diagram (a).

Examples of distribution changed according to a temperature are shown in a diagram (b). Once a command CMD is inputted into the control logic 160, a detection operation for a current temperature is performed by the voltage generator 170. If it is assumed that there is no offset and it is determined that a current temperature is the same as the reference temperature (i.e., about 50° C.), a temperature code Temp_code is generated as 0. Accordingly, V0 is outputted as an adjusted DC voltage (for example, a verify voltage). On the contrary, if a current temperature is higher than the reference temperature (i.e., about 50° C.), a verify voltage is selected as a value corresponding to the size of a temperature change. For example, when a verify voltage is selected as a value lower than a reference verify voltage V0 in an environment having a higher temperature than a reference temperature and then selected memory cells are programmed, reference distribution 200' is formed at the reference temperature (i.e., about 50° C.). That is, when a current temperature is higher than the reference temperature (i.e., about 50° C.), selected memory cells are programmed with a program state Pi by selecting one of verify voltages $V_{-4}$, $V_{-3}$, $V_{-2}$, and $V_{-1}$ during a program operation according to a difference of a reference voltage and a temperature. A threshold voltage of a memory cell programmed by one corresponding to a current temperature among verify voltages $V_{-4}$, $V_{-3}$, $V_{-2}$, and $V_{-1}$ may form a reference distribution 200' once it is restored to the reference temperature (i.e., about 50° C.). For example, according to the detected current temperature, the distribution 210 of memory cells programmed by a verify voltage $V_{-4}$ has a threshold voltage that is shifted into the reference distribution 200' at a reference temperature (i.e., about 50° C.). The distribution restoration according to this temperature is identically applied to the distributions 220, 230, and 240 of memory cells programmed by the adjusted verify voltages $V_{-3}$, $V_{-2}$, and $V_{-1}$.

Additionally, when a current temperature is lower than the reference temperature (i.e., about 50° C.) and a verify voltage lower than the reference verify voltage V0 is selected to program selected memory cells, the reference distribution 200' is restored at the reference temperature (i.e., about 50° C.). A threshold voltage of a memory cell programmed by one corresponding to a current temperature among the verify voltages $V_1$, $V_2$, $V_3$, and $V_4$ may form the reference distribution 200' when it is restored to the reference temperature (i.e., about 50° C.). The distribution restoration according to this temperature may be identically applied to the distributions 250, 260, 270, and 280 of memory cells programmed by the adjusted verify voltages $V_1$, $V_2$, $V_3$, and $V_4$.

Although compensation of a verify voltage according to a temperature change is described as one example, this is just a part of technical characteristics of the present invention. That is, adjustment for DC voltages during a read operation (for example, Vrd_std) and adjustment for an erase voltage during an erase mode may be performed using the above method.

Figure 9:
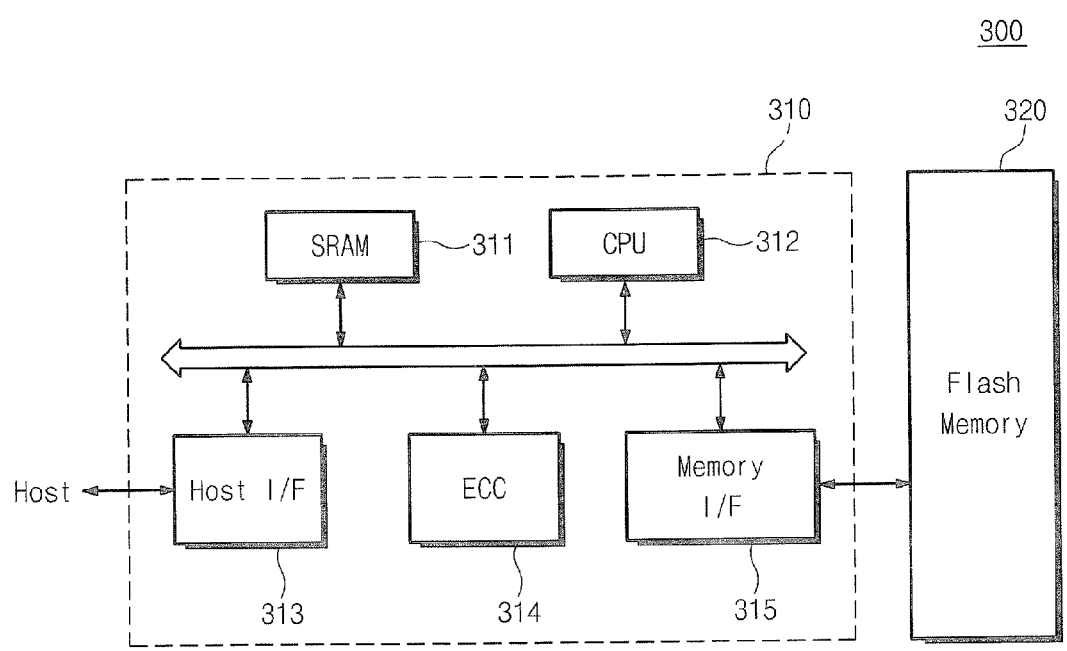
FIG. 9 is a block diagram illustrating a memory system according to an embodiment of the present invention.

FIG. 9 is a block diagram illustrating a memory system 300 including a flash memory device 320 for performing an adjustment operation of a DC voltage according to a temperature. Referring to FIG. 9, the memory system 300 includes the flash memory device 320 and a memory controller 310. The flash memory device 320 is substantially identical to the flash memory device 100 of FIG. 1 and thus its detailed description will be omitted. The memory controller 310 is configured to control the flash memory device 320. The combination of the flash memory device 320 and the memory controller 310 may be provided as a memory card or a semiconductor disk device such as a solid state disk (SSD).

A SRAM 311 is used as an operating memory of a central processing unit (CPU) 312. A host interface (I/F) 313 includes a data exchange protocol of a host connected to the memory system 300. An error correction block (ECC) 314 detects and corrects errors in data read from the flash memory device 320. The memory (I/F) 315 interfaces with the flash memory device 320. The CPU 312 performs a general control operation for data exchange of the memory controller 310. Although not illustrated in the drawing, it is apparent to those skilled in the art that the memory system 300 may further provide a ROM (not shown) for storing code data to interface with a host. The flash memory device 320 may be provided with a multi-chip package including a plurality of flash memory chips.

The memory system 300 may be provided as a storage device capable of providing stable access performance with respect to a change of temperature and other mounting environments. Accordingly, the memory system 300 can be provided as a storage medium having high data capacity and high data reliability. Especially, the flash memory device according to an embodiment of the present invention may be equipped in a memory system such as an SSD under an active development. In this case, the memory controller 310 may be configured to communicate with the external (e.g., a host) through one of protocols for various interfaces such as an universal serial bus (USB), a multi media card (MMC), a peripheral component interconnect express (PCI-E), an advanced technology attachment (ATA), a serial advanced technology attachment (SATA), a parallel advanced technology attachment (PATA), a small computer system interface (SCSI), an enhanced small disk interface (ESDI), and an integrated drive electronics (IDE).

The flash memory device is a non-volatile memory device retaining stored data even if power supply is cut off. As usage of mobile devices such as mobile phone, PDAs, digital cameras, portable game consoles, and MP3 players is increased, the flash memory device is widely used as a data storage and also a code storage. The flash memory device may be used for home application such as a high-definition television (HDTV), a digital versatile disk or a digital video disk (DVD), a router, and a global positioning system (GPS).

Figure 10:
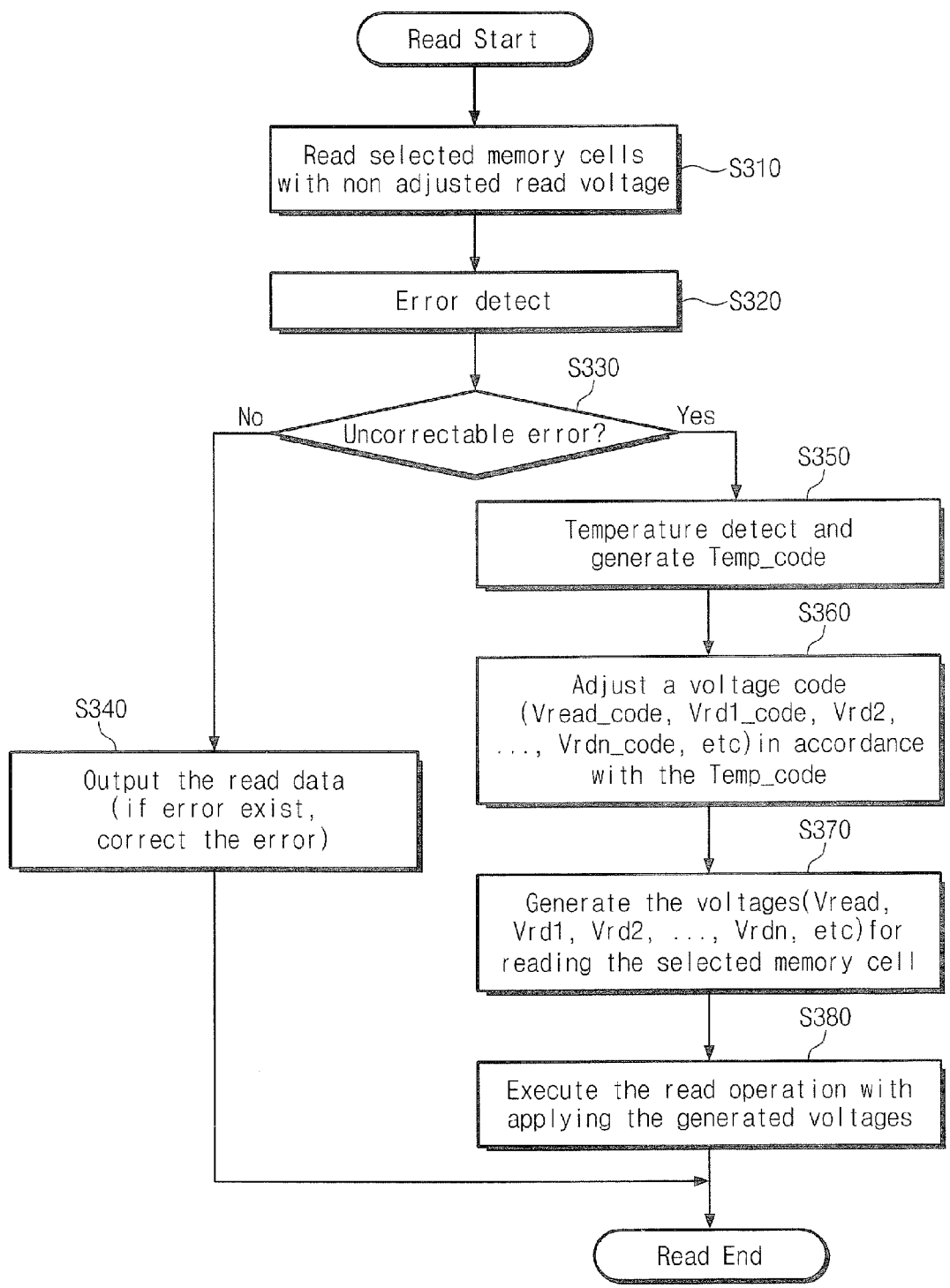
FIG. 10 is a flowchart illustrating an operation of a memory system of FIG. 9 according to an embodiment of the present invention.

FIG. 10 is a flowchart illustrating a reading method in the memory system 300 of FIG. 9 according to an embodiment of the present invention. Referring to FIG. 10, an error correction operation is performed parallel with the DC level adjustment operation. According to this reading method, performance of the memory system 300 can be improved. Hereinafter, procedures of a reading operation will be described with reference to FIG. 8.

Once a read request is made from a host, the memory controller 310 controls the flash memory 320 to perform sensing and latch operations on a region selected without a DC voltage adjustment in operation S310. The read data are delivered to the ECC 314 of the memory controller 310. The ECC 314 performs an error detection operation on the read data in operation S320. The ECC 314 determines whether errors in the read data have uncorrectable size or there is no error in the read data or errors in the read data have the correctible number of errors in operation 5330. If no error is detected, the ECC 314 outputs the read data to the host. If the correctible number of errors is detected, the ECC 314 performs an error correction operation on the read data to output the restored read data to the host. The host receives the outputted read data in operation S340. Once the read data are normally received, a general read operation is completed.

However, if errors detected by the ECC 314 are uncorrectable, the FCC 314 outputs a read fail message. Then, it proceeds to operation S350 for attempting a reading operation again by adjusting temperature detection and a DC voltage corresponding to the detected temperature of the flash memory device 320. Operation S350 for attempting a re-reading operation by adjusting a DC voltage (for example, a read voltage) is substantially identical to operations S210. Also, operations S360 to S380 are substantially identical to operations S220 to S240 of FIG. 7B. More detailed description is as follows. Once a read command CMD is inputted again by the memory controller 310, the flash memory device 320 detects a current temperature. The flash memory device 320 generates a temperature signal Temp_sgn by detecting a current temperature. The temperature signal Temp_sgn goes through quantization and encoding processes and then is outputted as a temperature code Temp_code in operation S350. The temperature code Temp_code needs to be a level code Level_code for generating a default value of a general DC voltage generated in a current operation mode. During a read operation, the level code Level_code is provided to selected memory cells, and includes read voltage codes Vrd1_code, Vrd2_code, ..., Vrdn_code for identifying each program state. Additionally, it may include a read voltage code Vread_code to turn on unselected memory cells. The temperature code Temp_code is added to the read voltage codes Vrd1_code, Vrd2_code, ..., Vrdn_code provided as a default value and a read voltage code Vread_code for turning on unselected memory cells. The adjusted level code Level_code' generated according to an addition of the temperature code Temp_code is delivered to the DC level generator 175 of FIG. 2. The flash memory device 320 generates the level code Level_code' adjusted by the temperature code Temp_code as general DC voltages consumed during a read operation. That is, the flash memory device 320 generates DC voltages Vrd1, Vrd2, . . . , Vrdn, and Vread corresponding to the adjusted level code Level_code' in operation 5370. Once general DC voltages Vrd1, Vrd2, . . . , Vrdn, and Vread for a read operation is generated completely, the flash memory device 320 applies these voltages to sense selected memory cells.

The memory system 300 according to an embodiment of the present invention is linked with an operation of the ECC 314 in the memory controller 310 such that overhead can be reduced more through a read operation for changing a DC level compared to an embodiment where a change occurs each time a command is inputted.

Figure 11:
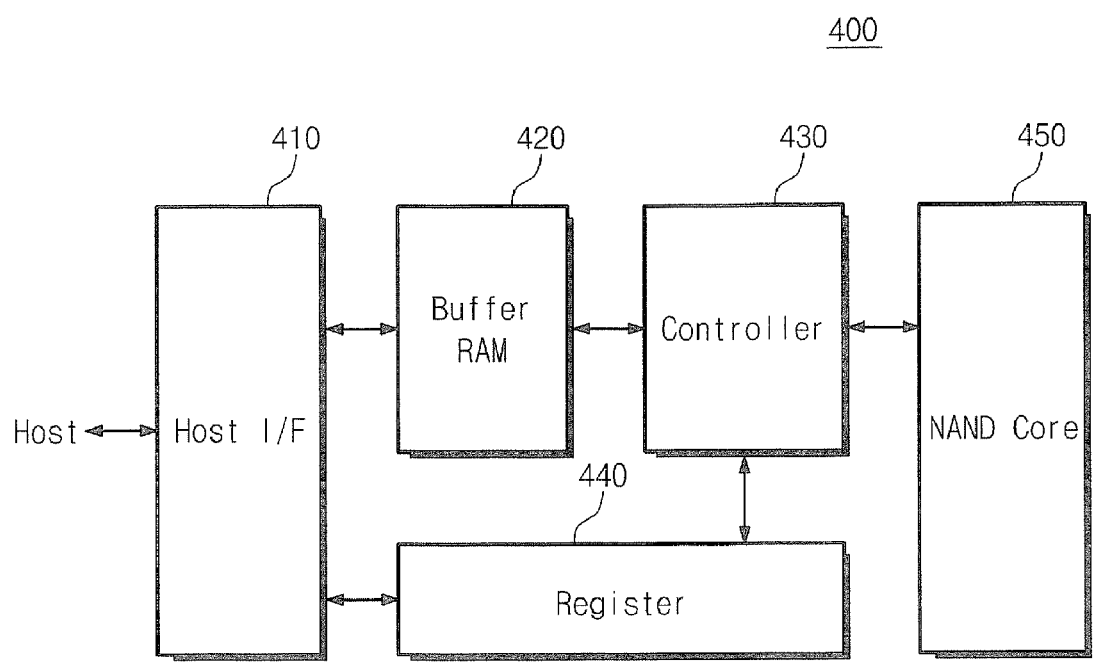
FIG. 11 is a block diagram illustrating a flash memory device according to another embodiment of the present invention.

FIG. 11 is a block diagram illustrating a fusion memory device with a structure according to an embodiment of the present invention. For example, technical features of the present invention can be applied to an OneNAND flash memory device 400 as a fusion memory device. Referring to FIG. 11, the OneNAND flash memory device 400 includes a host interface (I/F) 410, a buffer RAM 420, a controller 430, a register 440, and a NAND core 450. The host interface 410 exchanges various information with a device through respectively different protocol. The buffer RAM 420 has a code for driving a memory device therein and temporarily stores data. The controller 430 controls read and program operations and all states in response to a control signal and a command that are inputted from the external. The register 440 stores data such as commands, addresses and configurations defining a system operation environment in the memory device. The NAND core 450 includes a non-volatile memory cell and a page buffer. In response to an external command provided through the register 440, the controller 430 controls the NAND core 450 in order to detect a temperature and adjust a DC level according to the detected temperature. The controller 430 performs general procedures corresponding to an external command according to an adjusted DC level.

Figure 12:
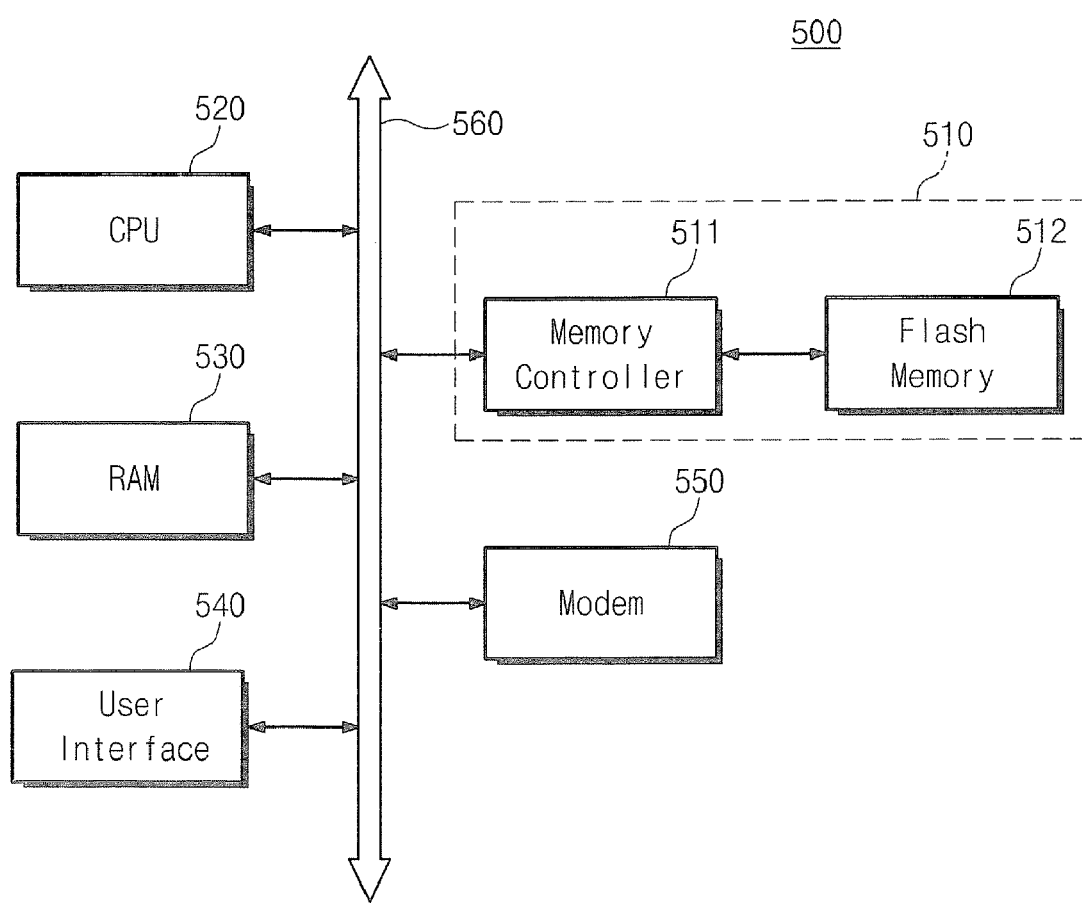
FIG. 12 is a block diagram illustrating a computing system according to an embodiment of the present invention.

FIG. 12 is a block diagram illustrating a computing system 500 including a flash memory device 512 according to an embodiment of the present invention. The computing system 500 includes a CPU 520, a RAM 530, a user interface 540, a modem 550 such as a baseband chipset, and a memory system 510, which are electrically connected to a system bus 560. The memory system 510 has the same configuration as FIG. 9 or FIG. 11. If the computing system is a mobile device, a battery (not shown) is additionally provided to supply an operation voltage of the computing system 500. Although not illustrated in the drawings, it is apparent to those skilled in the art that an application chipset, a camera image processor (CIS), a mobile DRAM, etc. can be further provided to the computing system 500. The memory system 510 may constitute a SSD using a non-volatile memory to store data. Or, the memory system 510 may be provided as a fusion flash memory (for example, an OneNAND flash memory). The flash memory device and/or the memory controller may be mounted using various types of packages. Examples of the packages include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

In the device and the method according to an embodiment of the present invention, characteristics of a non-volatile memory cell changed according to a temperature can be detected and compensated in real time. Accordingly, a non-volatile memory device and a memory system having a high reliability can be provided regardless of operational conditions.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory device comprising:
   a voltage generator adjusting a DC voltage supplied into the semiconductor memory device according to a current temperature; and
   a control logic activating a temperature detection operation of the voltage generator and an adjustment operation of the DC voltage according to an operation mode including at least one of program, read and erase modes;
   wherein the voltage generator adjusts the DC voltage according to the operation mode and offset information about the semiconductor memory device.

2. The semiconductor memory device of claim 1, wherein the voltage generator comprises:
   a temperature detector measuring the current temperature and outputting the measured current temperature as a temperature signal;
   a temperature code generator converting the temperature signal into a temperature code corresponding to the operation mode;
   a level code generator generating a level code so as to generate a DC voltage corresponding to the operation mode;
   an adder receiving the level code and the temperature code and outputting the received level code and temperature code as an adjusted level code; and
   a DC voltage generator generating a DC voltage corresponding to the adjusted level code.

3. The semiconductor memory device of claim 2, wherein the temperature code generator comprises:
   an analog-digital converter converting the temperature signal into a first code of a digital format;
   an encoder converting the first code into a second code; and
   a code generator selecting a temperature code corresponding to the second code according to the operation mode and the offset information.

4. The semiconductor memory device of claim 3, wherein the temperature code generator further comprises a temperature code register to provide temperature codes corresponding to the operation mode, the offset information, or the second code.

5. The semiconductor memory device of claim 4, wherein the code generator searches the temperature code register to select the temperature code.

6. The semiconductor memory device of claim 1, further comprising a memory unit to store the offset information.

7. A method of controlling a semiconductor memory device, the method comprising:
   receiving a command from an external;
   adjusting DC voltages consumed during a plurality of operation procedures constituting an operation mode corresponding to the command with reference to a current temperature and a offset value in each device, the operation mode including at least one of program, read and erase modes; and performing the plurality of operation procedures according to the adjusted DC voltages;

wherein the adjusting of the DC voltages comprises generating a temperature code with reference to at least one of the operation mode, the current temperature, and the temperature offset value.

8. The method of claim 7, wherein the adjusting of the DC voltages comprises:

measuring the current temperature with reference to a reference voltage and outputting a code corresponding to the measured current temperature;

generating the code as the temperature code with reference to the operation mode and the temperature offset value;

adding or subtracting the temperature code to or from a level code so as to generate a default value of the DC voltages; and generating the DC voltages using the level code to or from which the temperature code is added or subtracted.

9. The method of claim 7, wherein the adjusting of the DC voltages is activated only during a read operation where an uncorrectable error is detected.

10. A memory system comprising:

a plurality of semiconductor memory devices; and a memory controller controlling the plurality of semiconductor memory devices;

wherein each of the semiconductor memory devices comprises:

a temperature detector measuring a current temperature and outputting the measured current temperature as a temperature code;

a voltage generator adjusting a DC voltage supplied into the semiconductor memory device according to the temperature code; and a control logic activating a temperature detection operation of the temperature detector and an adjustment operation of the DC voltage according to an operation mode including at least one of program, read and erase modes;

wherein the voltage generator adjusts the DC voltage by code operation with the temperature code and an offset code; and wherein the offset code corresponds to the operation mode of the semiconductor memory device.

* * * * *